(12) United States Patent
Jiang

(10) Patent No.: US 9,099,497 B2
(45) Date of Patent: Aug. 4, 2015

(54) PIXEL DRIVE CIRCUIT AND PREPARATION METHOD THEREFOR, AND ARRAY SUBSTRATE

(71) Applicant: BOE TECHNOLOGY GROUP CO., LTD., Beijing (CN)

(72) Inventor: Chunsheng Jiang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/124,763

(22) PCT Filed: Nov. 23, 2012

(86) PCT No.: PCT/CN2012/085169
§ 371 (c)(1),
(2) Date: Dec. 9, 2013

(87) PCT Pub. No.: WO2013/127206
PCT Pub. Date: Sep. 6, 2013

(65) Prior Publication Data
US 2014/0103343 A1    Apr. 17, 2014

(30) Foreign Application Priority Data
Mar. 2, 2012    (CN) .......................... 2012 1 0054258

(51) Int. Cl.
*H01L 29/10* (2006.01)
*H01L 29/66* (2006.01)
(Continued)

(52) U.S. Cl.
CPC ........ *H01L 29/66969* (2013.01); *H01L 27/124* (2013.01); *H01L 27/1225* (2013.01); *H01L 27/1259* (2013.01); *H01L 29/7869* (2013.01)

(58) Field of Classification Search
CPC .................................................... H01L 29/7869
USPC ........................................... 257/43; 438/104
See application file for complete search history.

(56) References Cited

U.S. PATENT DOCUMENTS

2008/0239175 A1    10/2008    Moon et al.
2009/0121982 A1    5/2009    Choi et al.
(Continued)

FOREIGN PATENT DOCUMENTS

| CN | 101276107 A | 10/2008 |
|---|---|---|
| CN | 101859799 A | 10/2010 |
| CN | 102160102 A | 8/2011 |

OTHER PUBLICATIONS

First Chinese Office Action dated Nov. 13, 2013; Appln. No. 201210054258.0.
(Continued)

*Primary Examiner* — Jami M Valentine
(74) *Attorney, Agent, or Firm* — Ladas & Parry LLP

(57) ABSTRACT

The application discloses a pixel driving circuit and a fabrication method thereof as well as an array substrate, the pixel driving circuit including a switching and a driving TFT, the method including: on a substrate, fabricating a gate, a gate insulation GI layer, an oxide semiconductor layer, and an etching stop ESL layer simultaneously in turn; depositing simultaneously source/drain metals of the switching TFT and the driving TFT, the drain metal of the switching TFT extending and covering the GI layer on the gate of the driving TFT by etching; depositing a protection layer; etching off the protection layer, the drain metal of the switching TFT and the GI layer at a via hole by using a via hole process, to expose the gate of the driving TFT; depositing an ITO layer connecting the drain of the switching TFT and the gate of the driving TFT at the via hole.

12 Claims, 5 Drawing Sheets

(51) Int. Cl.
*H01L 27/12* (2006.01)
*H01L 29/786* (2006.01)

(56) References Cited

U.S. PATENT DOCUMENTS

| | | | |
|---|---|---|---|
| 2010/0051910 A1 | 3/2010 | Choi | |
| 2010/0072470 A1* | 3/2010 | Yamazaki et al. | 257/43 |
| 2010/0252832 A1* | 10/2010 | Asano et al. | 257/57 |
| 2011/0101302 A1* | 5/2011 | Zhou et al. | 257/13 |
| 2012/0249912 A1* | 10/2012 | Huang et al. | 349/42 |
| 2014/0159038 A1* | 6/2014 | Im | 257/43 |
| 2014/0160418 A1* | 6/2014 | Zhu et al. | 349/139 |

OTHER PUBLICATIONS

International Preliminary Report on Patentability Appln. No. PCT/CN2012/085169; Dated Sep. 2, 2014.
Second Chinese Office Action dated Jun. 30, 2014; Appln. No. 201210054258.0.
International Search Report mailed Mar. 7, 2013; PCT/CN2012/085169.
Third Chinese Office Action dated Nov. 4, 2014; Appln. No. 201210054258.0.

* cited by examiner

PIXEL DRIVE CIRCUIT AND PREPARATION METHOD THEREFOR, AND ARRAY SUBSTRATE

FIELD OF THE INVENTION

The present application relates to the display technical field, particularly to a pixel driving circuit and a fabrication method thereof as well as an array substrate including the pixel driving circuit.

BACKGROUND

A pixel driving circuit of an AMOLED (Active Matrix/Organic Light Emitting Diode panel) display usually adopts a TFT (Thin Film Field Effect Transistor), which acts as a driving OLED (Organic Light-Emitting Diode) or PLED (polymer light-emitting diode) panel. Compared to amorphous silicon, the concentration of the carrier of the TFT is ten times as large as that of amorphous silicon. In addition, the TFT can be fabricated by a sputtering method, and thus when the TFT is introduced, the production line of the existing liquid crystal panel need not to be changed to a great extent. Meantime, in the absence of ion implantation and laser crystallization equipment limitations, compared to polysilicon technology, it is more useful for the production of a glass backplate having a large area.

The pixel driving circuit contains two TFTs and a storage capacitor, where one TFT is a switching TFT, and another is a driving TFT. At the time of the activation of a scanning line, a certain voltage is applied to the gate of the switching TFT, and a current flows from the gate to the drain and is transmitted to the driving TFT through an ITO (Indium Tin Oxide) layer to turn on the driving TFT. The current flows from the gate to the drain while the driving TFT is connected with the storage capacitor, thus charging the capacitor. When the scanning line is turned off, the voltage stored in the capacitor can still keep the driving TFT in on state, and thus can maintain a fixed current of the OLED within a picture.

Since the switching TFT and the driving TFT are in different layers, the jump layer connection technique of the switching TFT and the driving TFT is a key technique. Currently, the following two modes are mainly used:

Mode 1: as shown in FIG. 1-1~FIG. 1-7, there is included mainly the following procedure: The gate metals 101 of the switching TFT and the driving TFT are deposited on a glass substrate and are etched, and a gate insulation (GI) layer 102 is deposited, to form a cross section diagram shown in FIG. 1-1;

An Indium Gallium Zinc Oxide (IGZO) layer 103 is deposited at the position of the switching TFT on the GI layer 102. By etching the IGZO layer 103 by using wet etching, and then depositing ESL (etching stop layer) layer 104 and etching, a cross section diagram shown in FIG. 1-2 is formed;

By using a dry etching technique, the GI layer 102 on the Gate metal 101 of the driving TFT is split to form a cross section diagram shown in FIG. 1-3, and the source/drain (S/D) metal 105 of the switching TFT and the S/D of the driving TFT (not shown in the drawings) are deposited to form a cross section diagram shown in FIG. 1-4; and Then a protection layer (PVX layer) 106 is deposited to form a cross section diagram shown in FIG. 1-5; a via hole etching is conducted to expose the drain of the switching TFT and the gate of the driving TFT to form a cross section diagram shown in FIG. 1-6; an ITO (Indium Tin Oxide) layer 107 is deposited to form a cross section diagram shown in FIG. 1-7, thus achieving a jump layer connection of the switching TFT and the driving TFT.

Although the method can achieve a reliable connection of the jump layer of the switching TFT and the driving TFT, when splitting the GI layer of the Gate metal of the driving TFT, it needs to add a mask MASK on the FIG. 1-2. Splitting by using the masking process goes against cost saving and decreases fabrication efficiency.

Mode 2: The gate metals 101 of the switching TFT and the driving TFT are deposited on a glass substrate and are etched, and a GI layer 102 is deposited, to form a cross section diagram shown in FIG. 1-1;

An IGZO layer 103 is deposited at the position of the switching TFT on the GI layer 102. By etching the IGZO layer 103 by using wet etching, and depositing ESL layer 104 and etching, a cross section diagram shown in FIG. 1-2 is formed;

The source/drain (S/D) metal 105 of the switching TFT and the S/D of the driving TFT (not shown in the drawings) are deposited, and then a protection layer 106 is deposited, to form a cross section diagram shown in FIG. 2-1; a via hole etching is conducted, and by using different etching ratio of the atmosphere adopted by the dry etching process for the drain metal (such as the metal of MO), the GI layer (nano SiOx) and the protection layer (SiNx), under the precondition that the drain metal is assured not to be etched off, the GI layer on the gate metal of the driving TFT is completely etched off, and a via hole is formed, to form a cross section diagram shown in FIG. 2-2; and subsequently, an ITO layer 107 is deposited to form a cross section diagram shown in FIG. 2-3, thus achieving a jump layer connection of the switching TFT and a driving TFT.

Although the adoption of the method can reduce a sheet of MASK, it needs to regulate the dry etching process, increase the different etching ratios of the dry etching atmosphere for the metal of Mo, SiOx, and SiNx and increase complexity of the process.

SUMMARY OF THE INVENTION

The present application provides a pixel driving circuit and a fabrication method thereof as well as an array substrate, for achieving a jump connection of a switching TFT and a driving TFT high efficiently.

The present application provides a fabrication method of a pixel driving circuit, the pixel driving circuit including a switching thin film field effect transistor TFT and a driving TFT, the method including:

a) on a substrate, fabricating a gate, a gate insulation GI layer, an oxide semiconductor layer, and an etching stop ESL layer of the switching TFT and the driving TFT simultaneously in turn;

b) depositing simultaneously source/drain metals of the switching TFT and the driving TFT, the drain metal of the switching TFT extending and covering the GI layer on the gate of the driving TFT by etching;

c) depositing a protection layer;

d) etching off the protection layer, the drain metal of the switching TFT and the GI layer at a via hole by using a via hole process, to expose the gate of the driving TFT; and e) depositing an Indium Tin Oxide ITO layer connecting the drain of the switching TFT and the gate of the driving TFT at the via hole.

The present application provides a pixel driving circuit, where the pixel driving circuit includes a switching thin film field effect transistor TFT and a driving TFT, each of the switching TFT and the driving TFT includes a gate, a gate insulation GI layer, an oxide semiconductor layer, an etching stop ESL layer and a source/drain, the drain of the switching TFT is connected with the gate of the driving TFT through the Indium Tin Oxide ITO layer, and the pixel driving circuit is fabricated by using the above mentioned fabrication method of the pixel driving circuit.

The present application provides an array substrate, the array substrate including the pixel driving circuit fabricated by using the above mentioned fabrication method of the pixel driving circuit.

The present application provides a pixel driving circuit, the pixel driving circuit includes a switching thin film field effect transistor TFT and a driving TFT, each of the switching TFT and the driving TFT includes a gate, a gate insulation GI layer, an oxide semiconductor layer, an etching stop ESL layer and a source/drain, and the drain of the switching TFT is connected with the gate of the driving TFT through the Indium Tin Oxide ITO layer, wherein, on a substrate, fabricating the gate, the gate insulation GI layer, the oxide semiconductor layer, and the etching stop ESL layer of the switching TFT and the driving TFT simultaneously in turn; depositing simultaneously source/drain metals of the switching TFT and the driving TFT, the drain metal of the switching TFT extending and covering the GI layer on the gate of the driving TFT by etching; depositing a protection layer; etching off the protection layer, the drain metal of the switching TFT and the GI layer at a via hole by using a via hole process, to expose the gate of the driving TFT; and depositing the Indium Tin Oxide ITO layer connecting the drain of the switching TFT and the gate of the driving TFT at the via hole.

The present application provides an array substrate, the array substrate includes a pixel driving circuit, the pixel driving circuit includes a switching thin film field effect transistor TFT and a driving TFT, each of the switching TFT and the driving TFT includes a gate, a gate insulation GI layer, an oxide semiconductor layer, an etching stop ESL layer and a source/drain, and the drain of the switching TFT is connected with the gate of the driving TFT through the Indium Tin Oxide ITO layer, wherein, on a substrate, fabricating the gate, the gate insulation GI layer, the oxide semiconductor layer, and the etching stop ESL layer of the switching TFT and the driving TFT simultaneously in turn; depositing simultaneously source/drain metals of the switching TFT and the driving TFT, the drain metal of the switching TFT extending and covering the GI layer on the gate of the driving TFT by etching; depositing a protection layer; etching off the protection layer, the drain metal of the switching TFT and the GI layer at a via hole by using a via hole process, to expose the gate of the driving TFT; and depositing the Indium Tin Oxide ITO layer connecting the drain of the switching TFT and the gate of the driving TFT at the via hole.

By using the pixel driving circuit and the fabrication method thereof as well as an array substrate, there exist the following advantageous effects:
1) since the gate of the driving TFT is only split thereon, the aperture ratio of the backplate is increased;
2) since the gate of the driving TFT is only split thereon, at the time of etching, it needs not to consider the etching rates when etching at different places, thus reducing the development and complexity of the process for etching rates of dry etching of SiOx and the metal of Mo;
3) under the condition of increasing aperture ratio of the backplate and reducing complexity of the process, the jump layer connection of the switching TFT and the driving TFT in one pixel is assured.

BRIEF DESCRIPTION OF THE DRAWINGS

FIG. 2-1~FIG. 2-3 are cross section diagrams obtained during fabricating a pixel driving circuit by using mode 2 in the prior art;

FIG. 3 is a flow chart of a fabrication method of a pixel driving circuit according to an embodiment of the present application;

FIG. 4-1~FIG. 4-4 are cross section diagrams obtained during fabricating a pixel driving circuit according to an embodiment of the present application; and FIG. 5 is a top view of a fabricated pixel driving circuit according to an embodiment of the present application.

DETAILED DESCRIPTION OF THE PREFERRED EMBODIMENTS

The pixel driving circuit and the fabrication method thereof as well as the array substrate provided by the present application will be described in detail below in conjunction with drawings and embodiments.

Figure 1:
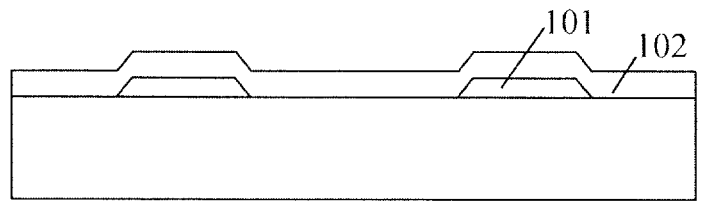
FIG. 1-1~FIG. 1-7 are cross section diagrams obtained during fabricating a pixel driving circuit by using mode 1 in the prior art.
Figures 1, 2:
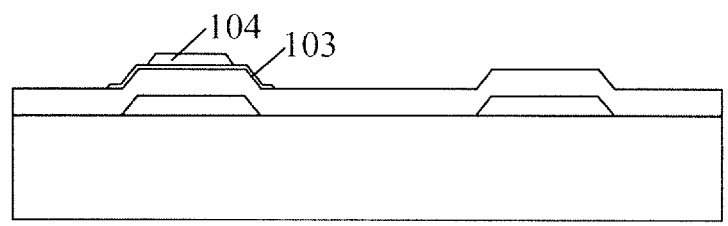
Figures 1, 2, 3:
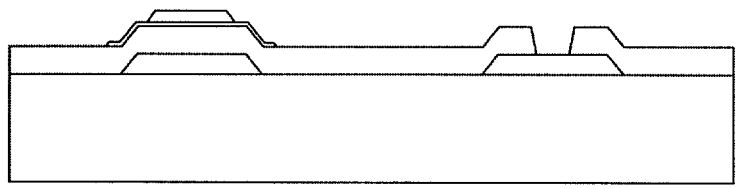

The fabrication method of the pixel driving circuit provided by an embodiment of the present application, the pixel driving circuit includes a switching thin film field effect transistor TFT and a driving TFT, as shown in FIG. 3, includes:

Step 301: on a substrate, a gate, a gate insulation GI layer, an oxide semiconductor layer, and an etching stop ESL layer of the switching TFT and the driving TFT are fabricated simultaneously in turn.

Each pixel of a display has a pixel driving circuit therewithin, the pixel driving circuit includes a switching TFT and a driving TFT, the switching TFT and the driving TFT adopt identical structures, what is different is that the switching TFT is connected with a data scanning line, and the driving TFT is connected with a storage capacitor.

Step 302: source/drain metals of the switching TFT and the driving TFT are deposited simultaneously, the drain metal of the switching TFT extends and covers the GI layer on the gate of the driving TFT by etching.

The source/drain (S/D) metals of the switching TFT and the driving TFT are deposited on the ESL, thus when a certain voltage is applied to the gate of the switching TFT/driving TFT, a current flows from the source to the drain of the switching TFT/driving TFT.

Step 303: a protection layer is deposited.

Specifically, the deposited protection layer covers the whole surface of the array substrate.

Step 304: the protection layer, the drain metal of the switching TFT and the GI layer at a via hole is etched off by using a via hole process, to expose the gate of the driving TFT.

Step 305: an Indium Tin Oxide ITO layer connecting the drain of the switching TFT and the gate of the driving TFT is deposited at the via hole.

The fabrication method of the pixel driving circuit provided by the embodiment of the present application adopts, during the fabrication process of the switching TFT and the driving TFT: extending the drain metal of the switching TFT and making it cover the gate metal of the driving TFT; splitting on the position by using an etching technique; etching off a protection layer, an S/D layer and a GI layer to form a via hole, to expose the gate metal on a backplate surface; and then depositing ITO, thus a jump layer connection of the switching TFT and the driving TFT is achieved. It can be seen that the following problems can be optimized due to the embodiments of the present application:
1) Since the gate of the driving TFT is only split thereon, the aperture ratio of the backplate is increased.
2) Since the gate of the driving TFT is only split thereon, at the time of etching, it needs not to consider the etching rates when etching at different places, thus reducing the development and complexity of the process for etching rates of dry etching of SiOx and the metal of Mo.
3) Under the condition of increasing aperture ratio of the backplate and reducing complexity of the process, the jump layer connection of the switching TFT and the driving TFT in one pixel is assured.

Embodiment 1

A fabrication method of a pixel circuit provided by an embodiment of the present application will be described in detail below in conjunction with FIG. 4-1~FIG. 4-4, the detailed process being as follows:

1) A gate metal is deposited on a glass substrate and is etched, to fabricate a gate 201 of the switching TFT and the driving TFT.

Specifically, the gate 201 herein includes a gate of the switching TFT and a gate of the driving TFT, and the specific etching process can adopt the existing method, which will be not be detailed again here.

Preferably, the metal of molybdenum Mo or molybdenum Mo/aluminum Al/molybdenum Mo is adopted specifically to fabricate the gates of the switching TFT and the driving TFT, wherein the Mo/Al/Mo is a three-layer metal, which are a Mo metal layer, an Al layer and an Mo metal layer. The two Mo metal layers take a protection effect, while the Al layer takes an electric conduction effect.

2) The gate insulation (GI) layers 202 of the switching TFT and the driving TFT are deposited.

Preferably, the deposited gate insulation layer 202 covers the whole surface of the glass substrate.

Specifically, silicon nitride SiNx or silicon oxide SiOx are adopted to fabricate the GI layer.

3) An oxide semiconductor layer 203 of the switching TFT and the driving TFT is deposited on the GI layer, and is etched.

Preferably, the oxide semiconductor layer 203 may adopt indium gallium zinc oxide IGZO, and may also adopt gallium zinc oxide IZO and etc.

Preferably, the IGZO layer is deposited and is etched by using wet etching, the etched IGZO layer is on the gates of the switching TFT and driving TFT, and a part of the area on the gate of the driving TFT is not covered by the IGZO layer, to facilitate the jump layer connection of the switching TFT and the driving TFT.

The embodiment is for clearly indicating the jump layer connection of the switching TFT and the driving TFT. FIG. 4-1 shows a cross section diagram of a part of the area on the gate of the driving TFT not covered by the IGZO layer.

4) An etching stop ESL layer 204 is deposited on the IGZO layer and is etched.

Preferably, the etched ESL layer is on the gates of the switching TFT and driving TFT. Since the ESL layer is deposited on the IGZO layer while a part of the area on the gate of the driving TFT is not covered by the IGZO layer, a part of the area on the gate of the driving TFT is also not covered by the ESL layer, so as to facilitate the jump layer connection of the switching TFT and the driving TFT. Specifically, silicon nitride SiOx is used to fabricate the ESL layer.

5) Source S/drain D metals of the switching TFT and the driving TFT are deposited, the drain metal 205 of the switching TFT is extended and covered the GI layer on the gate of the driving TFT by etching.

In an embodiment of the present application, preferably, the sputtering technique is adopted to deposit S/D metals and etch. After the etching, it is assured the drain metal 205 of the switching TFT covers the gate metal of the driving TFT to obtain the cross section diagram shown in FIG. 4-1. Preferably, the S/D metals adopt the metal of Mo or Mo/Al/Mo. It is sufficient that the specific etching technique adopts the existing etching process and it will not be detailed again here.

6) A protection layer (PVX layer) 206 is deposited.

Figures 1, 2, 3, 4:
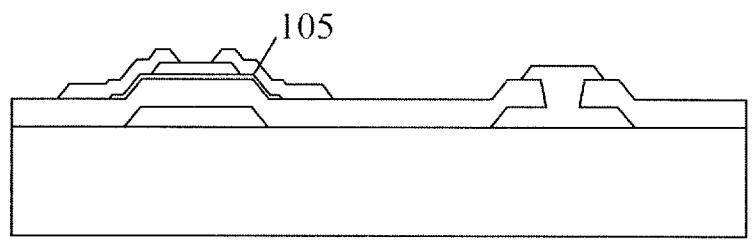

As shown in FIG. 4-2, the deposited protection layer 206 in the present embodiment covers the whole surface of the glass substrate. Preferably, silicon nitride SiNx or silicon oxide SiOx are adopted to fabricate the protection layer, specifically.

7) Via hole etching is performed on the gate of the driving TFT by using a dry etching process to etch off the protection layer, the drain metal of the switching TFT and the GI layer at a via hole, to form via hole and expose the gate of the driving TFT, to obtain the cross section diagram shown in FIG. 4-3.

8) An Indium Tin Oxide ITO 207 is deposited at the via hole to achieve the jump layer connection of the switching TFT and the driving TFT to obtain a cross section diagram shown in FIG. 4-4.

Figures 1, 2, 3, 4, 5:
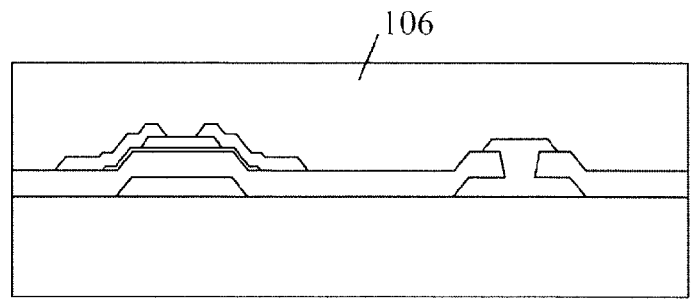
Figures 1, 2, 3, 4, 5, 6:
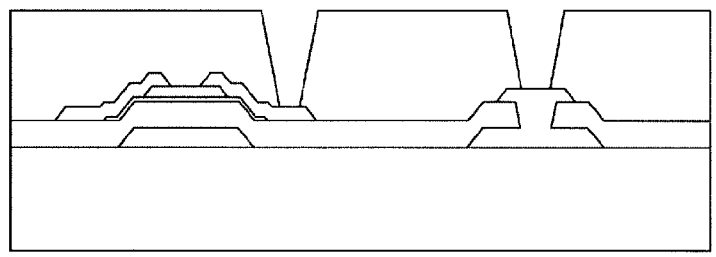
Figures 1, 2, 3, 4, 5, 6, 7:
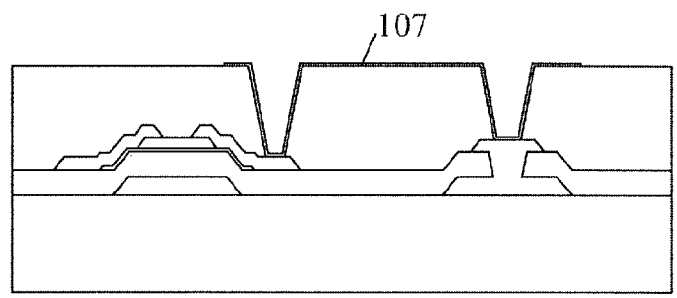
Figures 1, 2:
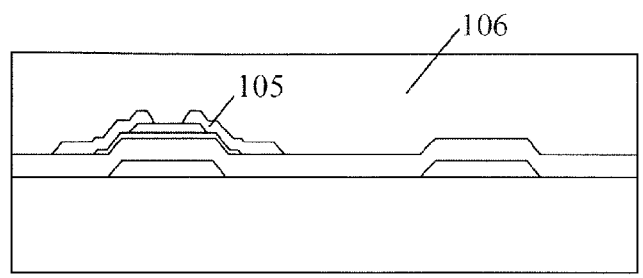
Figure 2:
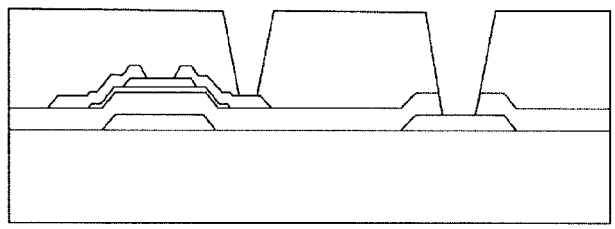
Figures 2, 3:
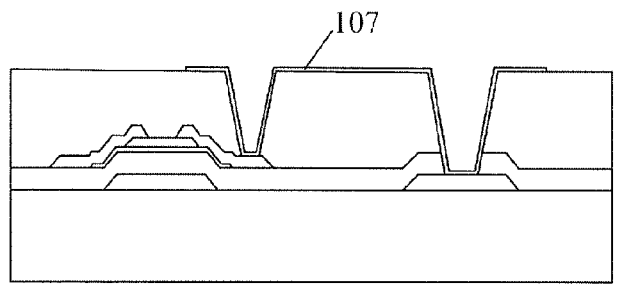
Figure 3:
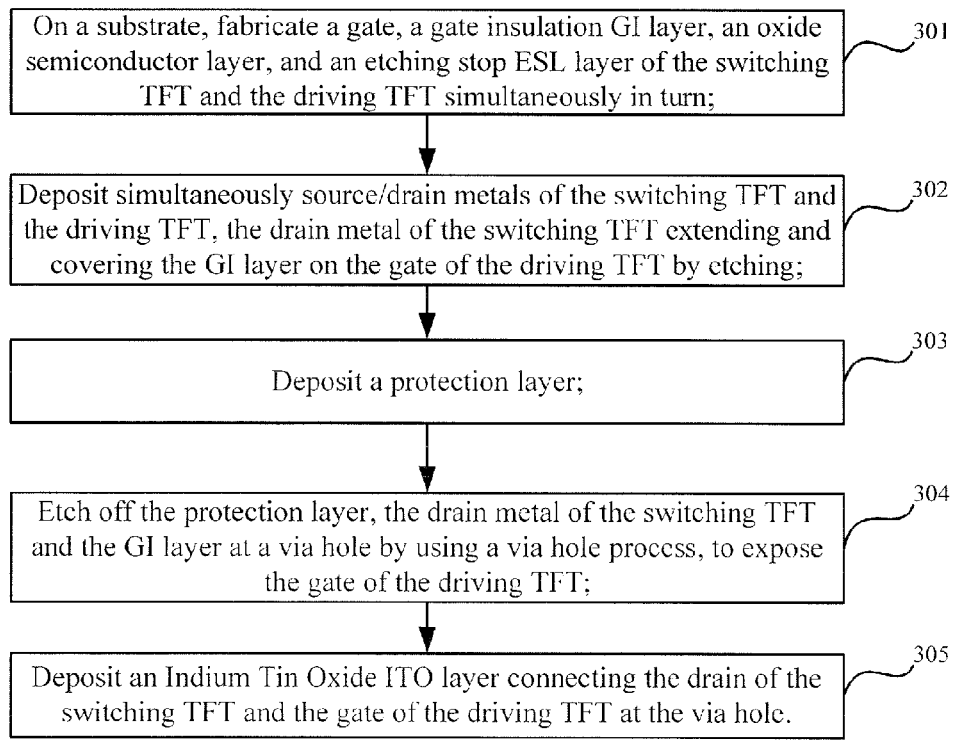
Figures 1, 4:
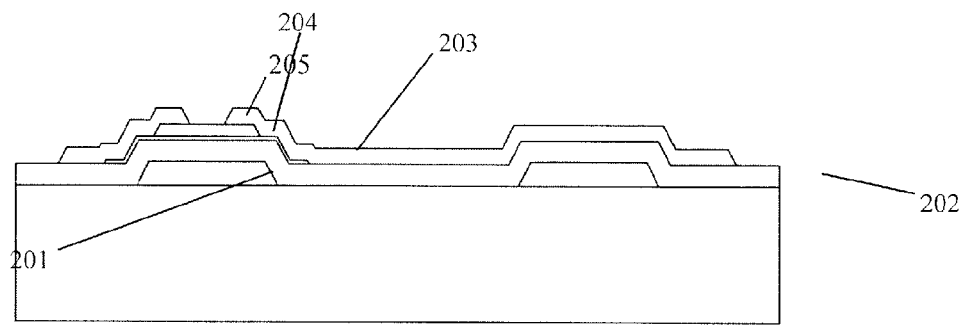
Figures 2, 4:
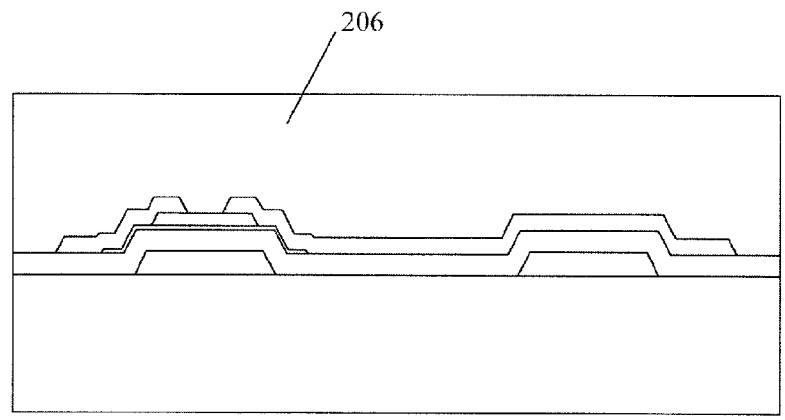
Figures 3, 4:
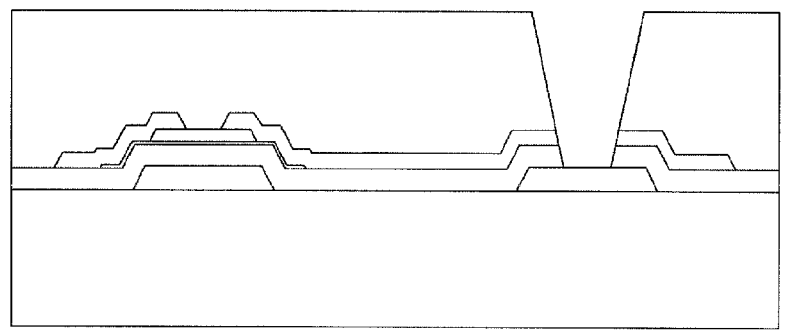
Figure 4:
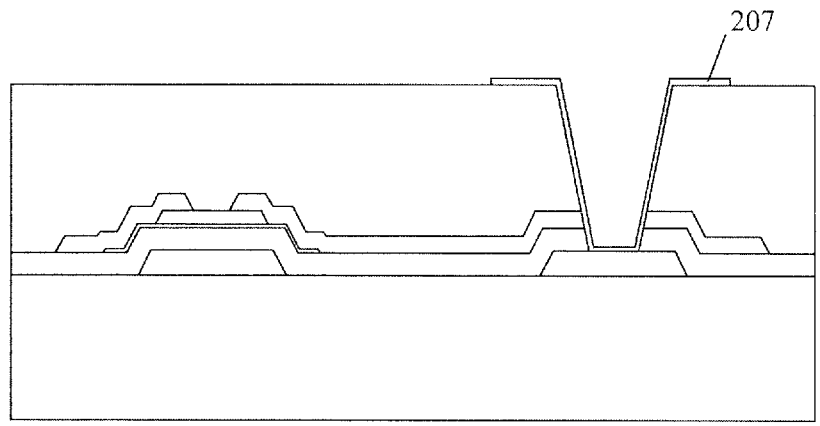
Figure 5:
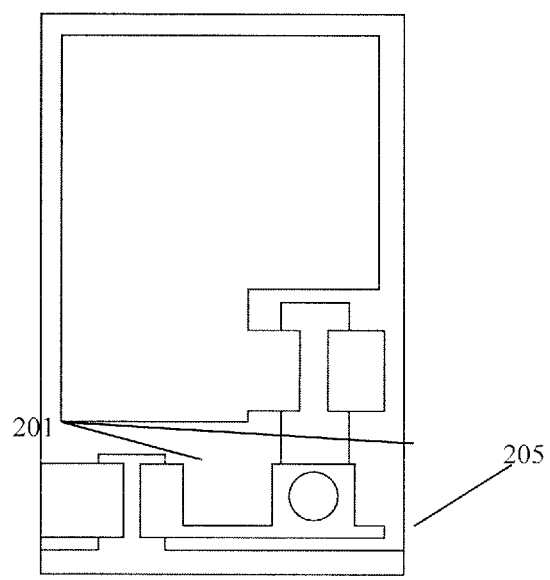

So far, the switching TFT and the driving TFT of the pixel driving circuit are fabricated and a jump layer connection is achieved. Further, the pixel driving circuit includes a storage capacitor and the driving TFT is connected with the storage capacitor, thus capable of achieving the function of the pixel driving circuit. FIG. 5 shows a top view of a pixel driving circuit in a pixel, where the drain 205 of the switching TFT is connected with the gate of the driving TFT through a via hole.

Embodiment 2

1) A gate metal is deposited on a glass substrate and is etched, to fabricate a gate 201 of the switching TFT and the driving TFT.

Specifically, the gate 201 herein includes a gate of the switching TFT and a gate of the driving TFT, and the specific etching process can adopt the existing method, which will be not be detailed again here.

Preferably, the metal of molybdenum Mo or molybdenum Mo/aluminum All molybdenum Mo is adopted specifically to fabricate the gates of the switching TFT and the driving TFT.

2) The gate insulation (GI) layers 202 of the switching TFT and the driving TFT are deposited.

Preferably, the deposited gate insulation layer 202 covers the whole surface of the glass substrate.

Specifically, silicon nitride SiNx or silicon oxide SiOx are adopted to fabricate the GI layer.

3) An oxide semiconductor layer 203 of the switching TFT and the driving TFT is deposited on the GI layer, and is etched.

Preferably, the IGZO layer is deposited and is etched by using wet etching, the etched IGZO layer is on the gates of the switching TFT and driving TFT, and a part G of the area on the gate of the driving TFT is not covered by the IGZO layer, to facilitate the jump layer connection of the switching TFT and the driving TFT.

4) An etching stop ESL layer 204 is deposited on the IGZO layer and is etched.

Preferably, the etched ESL layer is on the gates of the switching TFT and driving TFT. Since the ESL layer is deposited on the IGZO layer while a part of the area on the gate of the driving TFT is not covered by the IGZO layer, a part of the area on the gate of the driving TFT is also not covered by the ESL layer, so as to facilitate the jump layer connection of the switching TFT and the driving TFT. Specifically, silicon nitride SiOx is used to fabricate the ESL layer.

The embodiment is for clearly indicating the jump layer connection of the switching TFT and the driving TFT. FIG. 4-1 shows a cross section diagram of a part of the area on the gate of the driving TFT not covered by the ESL layer.

5) Source S/drain D metals of the switching TFT and the driving TFT are deposited, the drain metal 205 of the switching TFT extensively covers the GI layer on the gate of the driving TFT by etching.

In an embodiment of the present application, preferably, the sputtering technique is adopted to deposit S/D metals and etch. After the etching, it is assured the drain metal 205 of the switching TFT covers the gate metal of the driving TFT to obtain the cross section diagram shown in FIG. 4-1. Preferably, the S/D metals adopt the metal of Mo or Mo/Al/Mo. It is sufficient that the specific etching technique adopts the existing etching process and it will not be detailed again here.

6) A protection layer 206 is deposited.

As shown in FIG. 4-2, the deposited protection layer 206 in the present embodiment covers the whole surface of the glass substrate. Preferably, silicon nitride SiNx or silicon oxide SiOx are adopted to fabricate the protection layer, specifically.

7) Via hole etching is performed on the gate of the driving TFT, the protection layer at the via hole is etched off by using a dry etching process, then the drain metal of the switching TFT at the via hole is etched off completely by using a wet etching process, and finally the GI layer at the via hole is etched off by using a dry etching process, to form the via hole and expose the gate of the driving TFT, so as to obtain the cross section diagram shown in FIG. 4-3.

8) An Indium Tin Oxide ITO 207 is deposited at the via hole to achieve the jump layer connection of the switching TFT and the driving TFT to obtain a cross section diagram shown in FIG. 4-4.

The wet etching process and dry etching process mentioned by the embodiment of the present application can be achieved by adopting existing processes, and the etching process will not be detailed again here.

An embodiment of the present application further provides a pixel driving circuit, which includes a switching field effect transistor TFT and a driving TFT, each of the switching TFT and the driving TFT includes a gate, a gate insulation GI layer, an oxide semiconductor layer, an etching stop ESL layer and a source/drain, and the drain of the switching TFT is connected with the gate of the driving TFT through the Indium Tin Oxide ITO layer. The pixel driving circuit is obtained by using the fabrication method of a pixel driving circuit provided by the embodiment of the present application. The switching TFT and the driving TFT use commonly a via hole to achieve a jump layer connection. Since only one vial layer is used, the aperture ratio of the backplate is increased.

An embodiment of the present application provides an array substrate, which includes the pixel driving circuit obtained by adopting the fabrication method of the pixel driving circuit provided by the embodiment of the present application.

Obviously, those skilled in the art may make various modifications and variations to the present application without departing from the spirit and scope of the present application. Thus, if these modifications and variations to the present application belong to the scope of the claims of the present application and equivalents thereof, then the present application also intends to encompass these modifications and variations.

The invention claimed is:

1. A fabrication method of a pixel driving circuit, the pixel driving circuit including a switching thin film field effect transistor TFT and a driving TFT, the method including:
   a) on a substrate, fabricating a gate, a gate insulation GI layer, an oxide semiconductor layer, and an etching stop ESL layer of the switching TFT and the driving TFT simultaneously in turn;
   b) depositing simultaneously source/drain metals of the switching TFT and the driving TFT, the drain metal of the switching TFT extending and covering the GI layer on the gate of the driving TFT by etching;
   c) depositing a protection layer;
   d) etching off the protection layer, the drain metal of the switching TFT and the GI layer at a via hole by using a via hole process, to expose the gate of the driving TFT; and
   e) depositing an Indium Tin Oxide ITO layer connecting the drain of the switching TFT and the gate of the driving TFT at the via hole.

2. The method according to claim 1, wherein etching off the protection layer, the drain metal of the switching TFT and the GI layer at the via hole by using the via hole process in step d) further includes:
   performing via hole etching on the gate of the driving TFT by using a dry etching process to etch off the protection layer, the drain metal of the switching TFT and the GI layer at the via hole, to expose the gate of the driving TFT.

3. The method according to claim 1, wherein etching off the protection layer, the drain metal of the switching TFT and the GI layer at the via hole by using the via hole process in step d) further includes:
   performing via hole etching on the gate of the driving TFT, etching off the protection layer at the via hole by using a dry etching process, then etching off the drain metal of the switching TFT at the via hole by using a wet etching process, and finally etching off the GI layer at the via hole by using a dry etching process, to expose the gate of the driving TFT.

4. The method according to claim 1, wherein fabricating the oxide semiconductor layer in step a) further includes:
   depositing the oxide semiconductor layer on the GI layer and etching by using wet etching, the etched oxide semiconductor layer being on the gates of the switching TFT and driving TFT, and a part of the area on the gate of the driving TFT being not covered by the oxide semiconductor layer.

5. The method according to claim 4, wherein fabricating the ESL layer in step a) further includes:
   depositing the ESL layer on the oxide semiconductor layer and etching, the etched ESL layer being on the gate of the switching TFT and the gate of the driving TFT.

6. The method according to claim 1, wherein the gate of the switching TFT and the gate of the driving TFT are fabricated by using the metal of molybdenum Mo or using molybdenum Mo/aluminum Al/molybdenum Mo specifically.

7. The method according to claim 1, wherein the GI layer is fabricated by using silicon nitride SiNx or silicon oxide SiOx specifically.

8. The method according to claim 1, wherein the ESL layer is fabricated by using silicon oxide SiOx specifically.

9. The method according to claim 1, wherein the protection layer is fabricated by using silicon nitride SiNx or silicon oxide SiOx specifically.

10. The method according to claim 1, wherein the pixel driving circuit further includes a storage capacitor, the method further including:

f) connecting the driving TFT with the storage capacitor.

11. A pixel driving circuit, the pixel driving circuit includes a switching thin film field effect transistor TFT and a driving TFT, each of the switching TFT and the driving TFT includes a gate, a gate insulation GI layer, an oxide semiconductor layer, an etching stop ESL layer and a source/drain, and the drain of the switching TFT is connected with the gate of the driving TFT through the Indium Tin Oxide ITO layer, wherein, on a substrate, fabricating the gate, the gate insulation GI layer, the oxide semiconductor layer, and the etching stop ESL layer of the switching TFT and the driving TFT simultaneously in turn;

depositing simultaneously source/drain metals of the switching TFT and the driving TFT, the drain metal of the switching TFT extending and covering the GI layer on the gate of the driving TFT by etching;

depositing a protection layer;

etching off the protection layer, the drain metal of the switching TFT and the GI layer at a via hole by using a via hole process, to expose the gate of the driving TFT; and depositing the Indium Tin Oxide ITO layer connecting the drain of the switching TFT and the gate of the driving TFT at the via hole.

12. An array substrate, the array substrate includes a pixel driving circuit, the pixel driving circuit includes a switching thin film field effect transistor TFT and a driving TFT, each of the switching TFT and the driving TFT includes a gate, a gate insulation GI layer, an oxide semiconductor layer, an etching stop ESL layer and a source/drain, and the drain of the switching TFT is connected with the gate of the driving TFT through the Indium Tin Oxide ITO layer, wherein, on a substrate, fabricating the gate, the gate insulation GI layer, the oxide semiconductor layer, and the etching stop ESL layer of the switching TFT and the driving TFT simultaneously in turn;

depositing simultaneously source/drain metals of the switching TFT and the driving TFT, the drain metal of the switching TFT extending and covering the GI layer on the gate of the driving TFT by etching;

depositing a protection layer;

etching off the protection layer, the drain metal of the switching TFT and the GI layer at a via hole by using a via hole process, to expose the gate of the driving TFT: and depositing the Indium Tin Oxide ITO layer connecting the drain of the switching TFT and the gate of the driving TFT at the via hole.

\* \* \* \* \*